US005592120A

United States Patent [19]

Palmer et al.

[11] Patent Number: 5,592,120
[45] Date of Patent: Jan. 7, 1997

[54] CHARGE PUMP SYSTEM

[75] Inventors: Wyn Palmer, N. Andover; Fernando Viana, Cambridge, both of Mass.

[73] Assignee: Analog Devices, Inc., Norwood, Mass.

[21] Appl. No.: 514,389

[22] Filed: Aug. 11, 1995

Related U.S. Application Data

[63] Continuation of Ser. No. 302,351, Sep. 7, 1994, abandoned.

[51] Int. Cl.$^6$ ............................................. G05F 1/10
[52] U.S. Cl. ........................... 327/536; 327/157; 331/17; 331/25
[58] Field of Search ........................... 327/306, 307, 327/308, 309, 310, 530, 531, 534, 100, 157, 536, 537, 148; 331/1 A, 16, 17, 8, 10, 18, 25

[56] References Cited

U.S. PATENT DOCUMENTS

| | | | |
|---|---|---|---|
| 4,167,711 | 9/1979 | Smoot | 331/17 |
| 4,631,421 | 12/1986 | Inoue et al. | 307/297 |
| 4,714,900 | 12/1987 | Sata | 331/8 |
| 4,847,519 | 7/1989 | Wahl et al. | 307/296.2 |
| 4,883,976 | 11/1989 | Deane | 307/291.2 |
| 5,015,970 | 5/1991 | Williams et al. | 331/11 |
| 5,052,022 | 9/1991 | Nishita et al. | 375/4 |
| 5,095,288 | 3/1992 | Dent | 331/17 |
| 5,180,993 | 1/1993 | Dent | 331/25 |
| 5,184,028 | 2/1993 | Zobel | 307/270 |
| 5,212,456 | 5/1993 | Kovalcik et al. | 330/261 |
| 5,278,522 | 1/1994 | Atriss et al. | 331/57 |
| 5,332,930 | 7/1994 | Volk | 307/270 |
| 5,339,272 | 8/1994 | Tedrow et al. | 365/189.09 |
| 5,424,689 | 6/1995 | Gilig et al. | 331/17 |

*Primary Examiner*—Timothy P. Callahan
*Assistant Examiner*—Kenneth B. Wells
*Attorney, Agent, or Firm*—Iandiorio & Teska

[57] ABSTRACT

A charge pump system for charging an integrating capacitor includes a current source for supplying a first current of a first polarity, a second current of the opposite polarity which is a fraction of the first current, a third current of the opposite polarity, and a fourth current of the first polarity which is a fraction of the third current, and a switching device for simultaneously interconnecting both the first and second currents to the integrating capacitor to provide a first pump down charging current which is the fractional difference between the first and second currents, and also alternately selectively interconnecting both the third and fourth currents to the integrating capacitor to provide a second pump up charging current which is a fractional difference between the third and fourth currents and opposite in polarity to the first charging current.

6 Claims, 7 Drawing Sheets

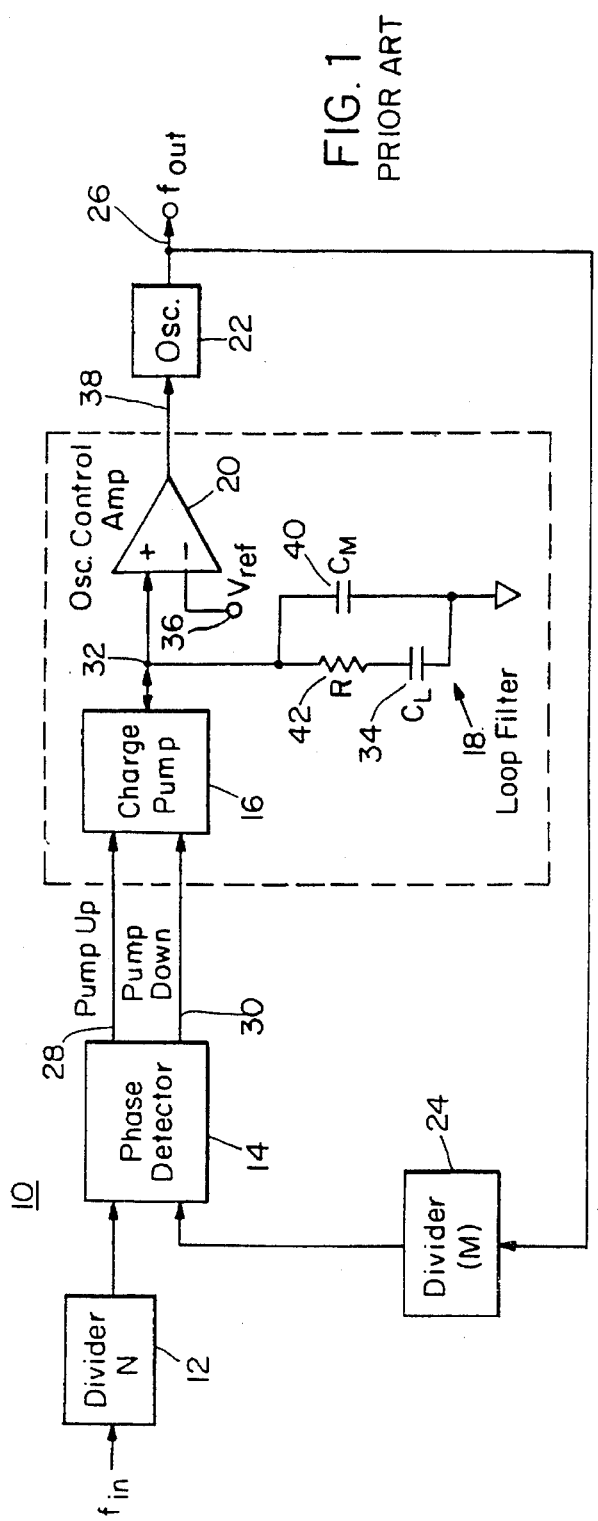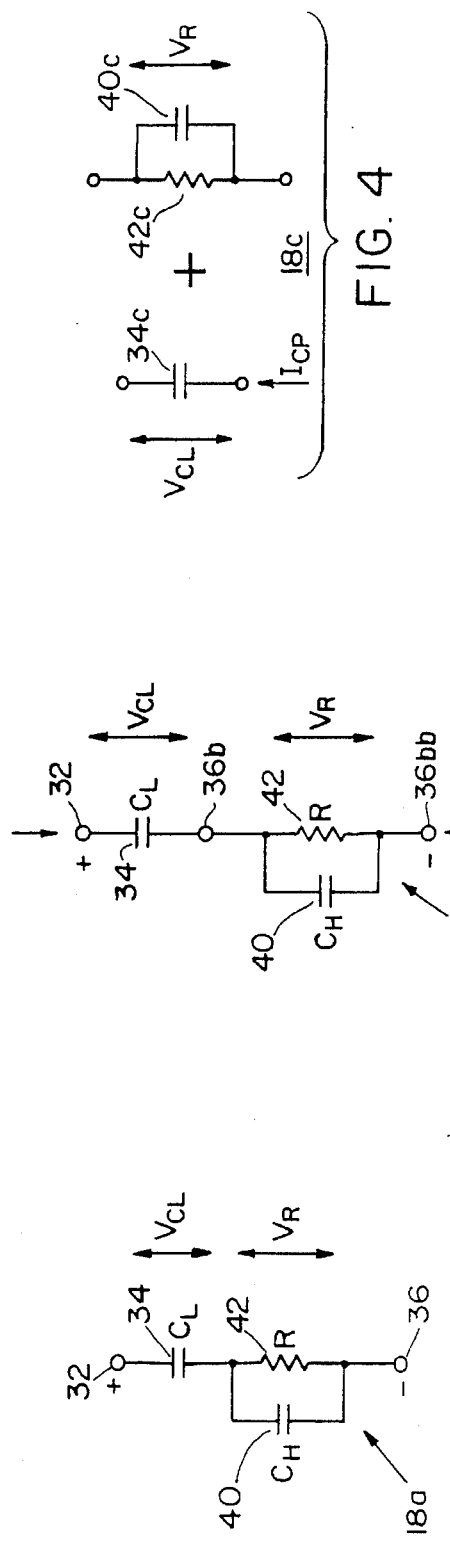

CHARGE PUMP SYSTEM

This is a continuation of application Ser. No. 08/302,351 filed Sep. 7, 1994, abandoned.

FIELD OF INVENTION

This invention relates to a charge pump system for charging an integrating capacitor, and more particularly to such a system for developing very low charging currents.

BACKGROUND OF INVENTION

Frequency synthesizers employ a feedback loop to lock the output, $f_o$, to the input, $f_i$. A phase detector responds to a difference in phase between the divided down input $f_{in}/N$ and the divided down feedback output $f_o/M$ by producing the appropriate charge up or charge down command to a charge pump. The charge pump pumps up or down the low frequency integrating capacitor increasing or decreasing, respectively, the voltage on it. The change in voltage drives an oscillator control amplifier which in turn drives an oscillator to increase or decrease the frequency $f_o$ to null the difference at the phase detector. In order to avoid positive feedback and to stabilize the system a high frequency capacitor, $C_H$, is disposed in parallel with the integrating capacitor and a resistor, R, is placed in series with it. Typically $C_H$ is small (approximately $50_{pf}$) and can be mounted on board the frequency synthesizer chip as can $R_1$ (approximately 1 KΩ) but $C_L$ is large (approximately 20,000 pf) and cannot easily be located on board and so is usually mounted as an external capacitor. One attempt, to mount it on the chip, distributes it widely across the chip under power supplies, buses and other elements. This assumes a low noise environment and ample buses and components to provide the necessary area. Another approach to this problem recognizes that at low frequencies the impedance of $C_H$ is not significant, at high frequencies the impedance of $C_L$ is not significant, and at mid-frequencies the impedance is essentially R. Therefore the $C_L$ and the $R_1C_H$ components can be considered as a series network with the same current $I_{CP}$ through all of them. Thus each of those networks can be treated separately so long as the voltage across them and their time constants remain the same. Therefore one could substantially reduce the current (to 1 μa for example) through the larger external capacitor $C_L$ and so dramatically reduce its size, down to 50 pf, for example.

However, reducing the current to low levels runs the risk of producing deadbands due to the switches not switching properly in the charge pump. In addition the possible coupling induces charge injection from the semiconductor switches which is as large or even larger than the switched current and out of phase so that it can cause instability.

SUMMARY OF INVENTION

It is therefore an object of this invention to provide an improved charge pump system.

It is a further object of this invention to provide such a charge pump system which develops very low current.

It is a further object of this invention to provide such a charge pump system which develops low current without introducing switching problems, deadbands, charge injection or instability.

It is a further object of this invention to provide such a charge pump system which uses extremely low current circuits compatible with small capacitors that can be mounted on board integrated circuit chips.

The invention results from the realization that a truly effective charge pump which, without introducing switching problems, deadbands, charge injection and instability, provides a very low current compatible with an integrating capacitor small enough to be mounted on board an integrated circuit chip can be effected by utilizing two pairs of switches to combine opposite polarity currents whose differences constitute the small pump up and pump down currents developed by the charge pump.

This invention features a charge pump system for charging an integrating capacitor. There are current source means for supplying a first current of the first polarity, a second current of the opposite polarity which is a fraction of the first current, and a third current of the opposite polarity, and a fourth current of the first polarity which is a fraction of the first current. Switching means simultaneously interconnect both the first and second currents to the integrating capacitor to provide a first pump down charging current which is the fractional difference between the first and second currents, and alternately selectively interconnects both the third and fourth currents to the integrating capacitor to provide a second pump up charging current which is the fractional difference between the third and fourth currents and opposite in polarity to the first charging current.

In a preferred embodiment the current source means may include a first pump down current source for supplying a first current of a first polarity and a second pump down current source for supplying a second current of opposite polarity which is a fraction of the first current. The current source means may include a first pump up current source for providing a first current of the opposite polarity and a second current source for supplying a fourth current of the first polarity which is a fraction of the third current. The switching means may include a first switching circuit for simultaneously interconnecting both the first and second current sources to the integrating capacitor to provide a first charging current which is the fractional difference between the first and second currents, and a second switching circuit for simultaneously alternately with the second switching circuit interconnecting both the first and second pump up current sources to the integrating capacitor to provide a second charging current which is the fractional difference between the third and fourth currents and opposite in polarity to the first charging current. The system may include a matching circuit for equalizing the first and third currents and the second and fourth currents, respectively. The matching circuit may include fifth and sixth opposite polarity current sources which are ratioed to the first and third current sources or the second and fourth current sources. The fifth and sixth current sources may be connected to a common node and there may be means for comparing the voltage on the integrating capacitor and the voltage at the common node and adjusting the current output of at least one of the fifth and sixth current sources to correct any difference in those voltages.

The invention also features a charge pump system for charging an integrating capacitor including a first pump down current source for supplying a first current of a first polarity and a second pump down current source for supplying a second current of opposite polarity which is a fraction of the first current. There is a first switching circuit for simultaneously interconnecting both the first and second current sources to the integrating capacitor to provide a first charging current which is the fractional difference between the first and second currents. There is a first pump up current source for supplying a third current of the opposite polarity and a second pump up current source for supplying a fourth current of the first polarity which is a fraction of the third current. A second switching circuit simultaneously and alternately with the first switching circuit interconnects both the first and second pump up current sources to the integrating capacitor to provide a second charging current which is the fractional difference between the third and fourth currents and opposite in polarity to the first charging current.

The invention also features a differential charge pump system for charging an integrating capacitor which includes first and second charge pumps each including a current source means for supplying a first current of a first polarity, a second current of the opposite polarity which is a fraction of the first current, a third current of the opposite polarity and a fourth current of the first polarity which is a fraction of the third current. It also contains switching means for simultaneously interconnecting both the first and second currents to one end of the integrating capacitor to provide a first pump down charging current which is the fractional difference between the first and second currents and alternately selectively interconnecting both the third and fourth currents to the other end of the integrating capacitor to provide a second pump up charging current which is the fractional difference between the third and fourth currents of opposite polarity to the first charging current.

In a preferred embodiment there may be a common mode servo circuit for sensing the voltage on each side of the integrating capacitor and driving the charge pumps to maintain a predetermined midpoint voltage on the integrating capacitor.

BRIEF DESCRIPTION OF THE DRAWINGS

Other objects, features and advantages will occur to those skilled in the art from the following description of a preferred embodiment and the accompanying drawings, in which:

FIG. 1 is a schematic block diagram of a prior art frequency synthesizer;

FIG. 2 is a schematic diagram of an alternative construction of the loop filter of FIG. 1;

FIG. 3 is a schematic equivalent circuit of the loop filter of FIG. 2;

FIG. 4 is a schematic of a further equivalent circuit for the loop filter shown in FIG. 3;

DETAILED DESCRIPTION OF THE PREFERRED EMBODIMENTS

Figure 5:
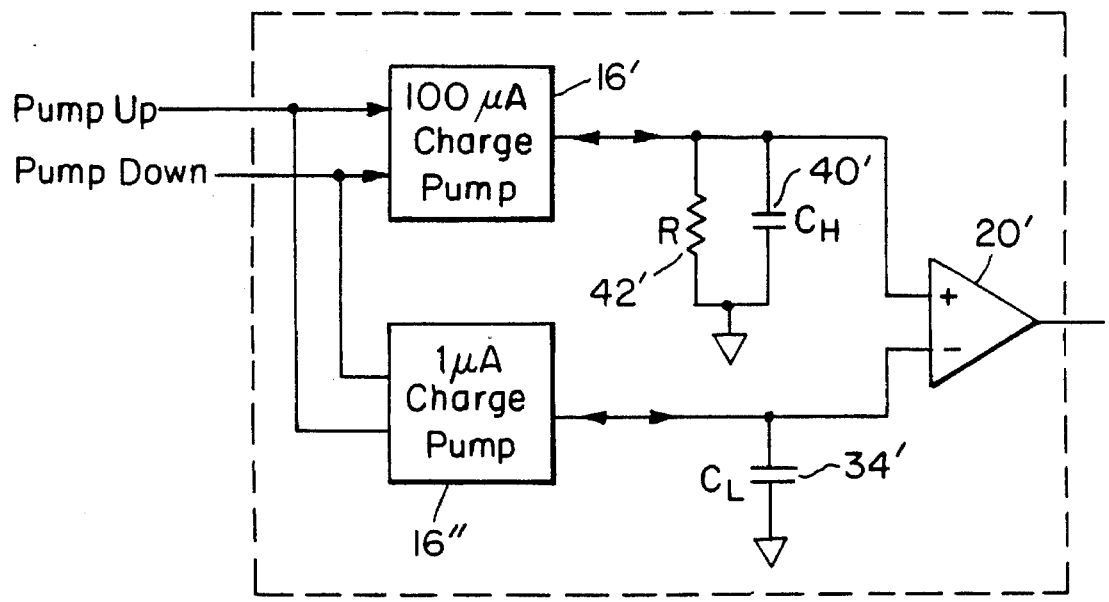
FIG. 5 is an improved loop filter, charge pump, and oscillator control amplifier according to this invention.

There is shown in FIG. 1 a frequency synthesizer 10 including divider 12, phase detector 14, charge pump 16, loop filter 18, oscillator control amplifier 20, oscillator 22, and feedback divider 24. In operation an input signal $f_{in}$ having a first frequency is submitted to a divider 12 which divides by a factor of N and provides its output $f_{in}/N$ to phase detector 14. Phase detector 14 detects any phase difference between $f_{in}/N$ and $f_{out}/M$, with the output signal at terminal 26 divided by M in divider 24. If $f_{in}/N$ leads $f_{out}/M$, phase detector 14 provides a pump up signal on line 28. If $f_{in}/N$ lags $f_{out}/M$, phase detector 14 provides a pump down signal on line 30. Charge pump 16 responds to a pump up signal by increasing the current delivered through node 32 to integrating capacitor 34, $C_L$. The pump down signal results in the removal of charge through node 32 from integrating capacitor 34. The concomitant rise or fall of voltage at node 32 is sensed with respect to a reference input 36 by oscillator control amplifier 20. The difference is reflected by output line 38 to increase or decrease the frequency of oscillator 22 at output 26. This output $f_{out}$ is also fed back to divider 24 where it is divided by M and submitted to phase detector 14. In this way the inputs to phase detector 14, $f_{in}/N$ and $f_{out}/M$, are kept equal. High pass capacitor $C_H$ 40 and resistor 42 are employed in loop filter 18 in order to insure that there is not a phase inversion or a 180° phase shift at the output 26 which would cause positive feedback and destabilize the entire system 10.

Typically integrating capacitor 34, $C_L$ is quite large, in the range of 20,000 pf, and is too large to be mounted on board an integrated circuit chip. High pass filter $C_H$ 40 is in the range of 50 pf and is small enough to be mounted on board. The problems with the large size of integrating capacitor 34 resulting from its inability to be mounted on board the chip is explained in the Background of Invention above.

It has been recognized that since low frequency capacitance 34 will be virtually a short at higher frequencies and high frequency capacitor 40 will be virtually an open circuit at lower frequencies, loop filter 18 can be reconfigured as shown by loop filter 18a, FIG. 2, where capacitor 34 is connected in series with the parallel combination of capacitor 40 and resistor 42. The voltage across capacitor 34 is $V_{CL}$ and that across resistor 42 and capacitor 40 is $V_R$. Thus if the same current, $I_{CP}$, flows through both resistor 42 and the parallel connector capacitor 40 and capacitor 34, as shown in loop filter 18b, FIG. 3, the reference point 36b need not be the specific reference as shown in FIG. 1 but may be at any selected reference level, and the voltage is connected across the entire network from node 32 to terminal 36bb. Therefore, the two sections of loop filter 18b, FIG. 3, can be looked at as distinct components as shown in FIG. 4, where both have the same current $I_{CP}$ flowing through them. This suggests that so long as the time constants are maintained the current and thus the capacitance, can be changed. Therefore the capacitance 34c, which is traditionally too large to fit on board an integrated circuit chip, may be made small by proportionally reducing current $I_{CP}$ through it in order to maintain the proper time constant.

With this understanding, charge pump 16 can be broken into two charge pumps 16' and 16", FIG. 5. Charge pump 16' delivers a charge in the normal range, such as 100 microamps, to resistor 42' and capacitor 40', whereas the other charge pump 16" provides a very small current in the range of 1 microamp to integrating capacitor 34'. With this very small charging current of 1 microamp in charge pump 16", integrating capacitor 34' can be reduced to a much more manageable size such as 50 pf that can be easily mounted on board an integrated circuit chip. Oscillator control amplifier 20' has its positive terminal connected to the output of charge pump 16'. Its negative input, however, is no longer connected to the reference point 36 as in FIG. 1; it is now connected to integrating capacitor 34' and the output of charge pump 16". However, developing such small currents introduces a number of additional problems such as switching problems, which can result in deadbands, and charge injection, which may result in instability. This can be overcome with the circuit shown in FIG. 6.

Figure 6:
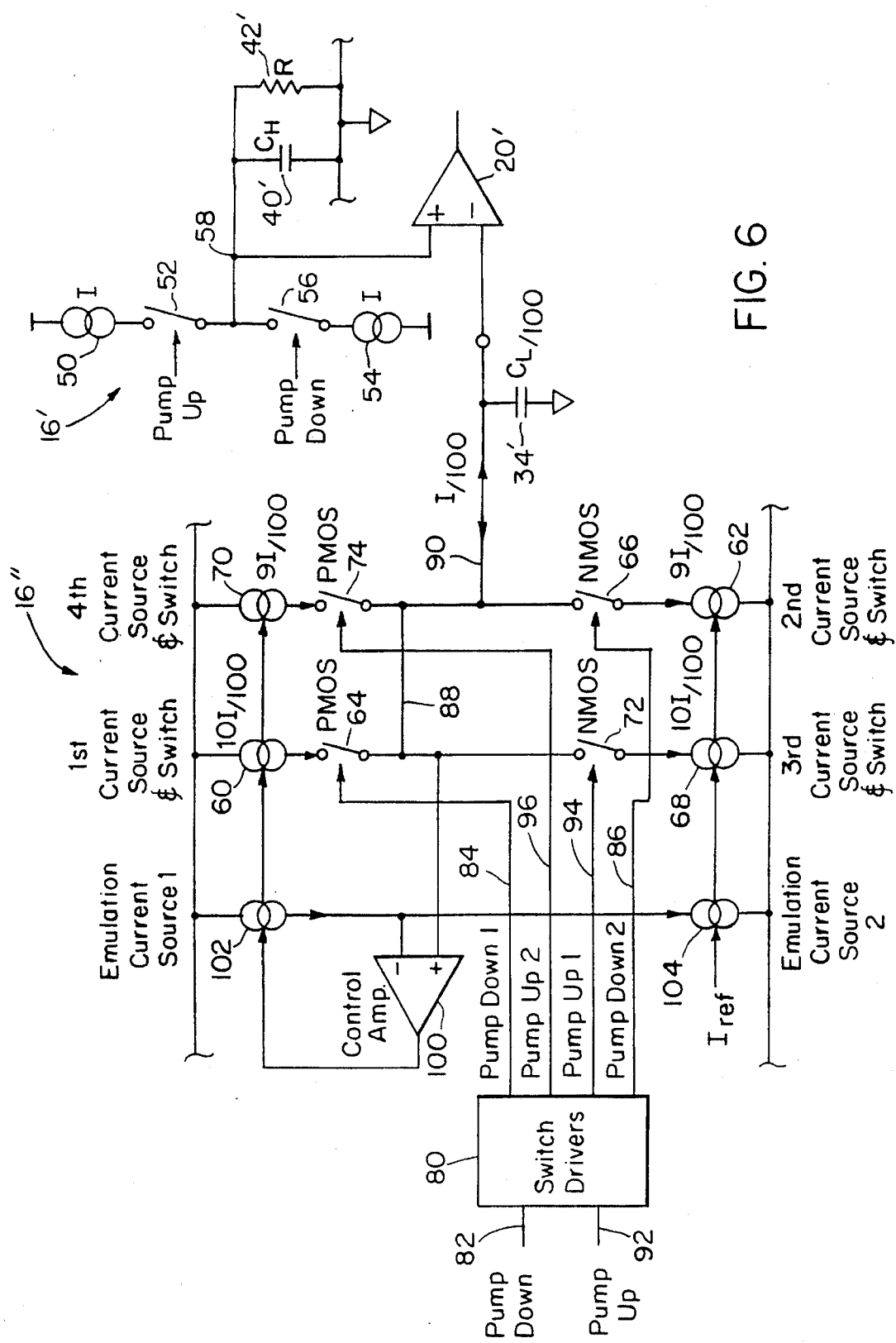
FIG. 6 is a more detailed schematic diagram of the charge pump, loop filter and oscillator control amplifier of FIG. 5.
Figure 7A:
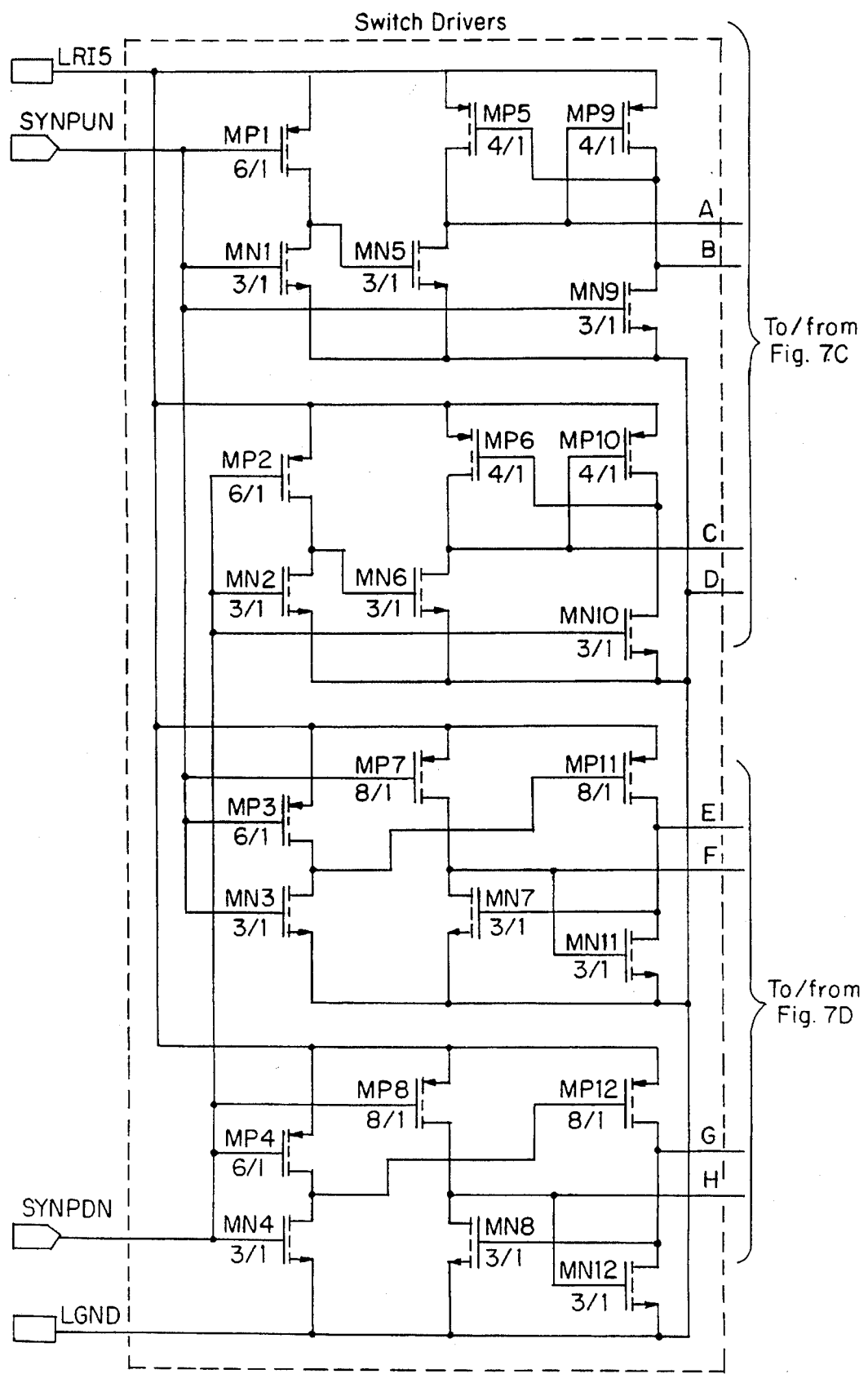
FIGS. 7A–D are a detailed schematic of one implementation of the loop filter of FIG. 6.
Figure 7B:
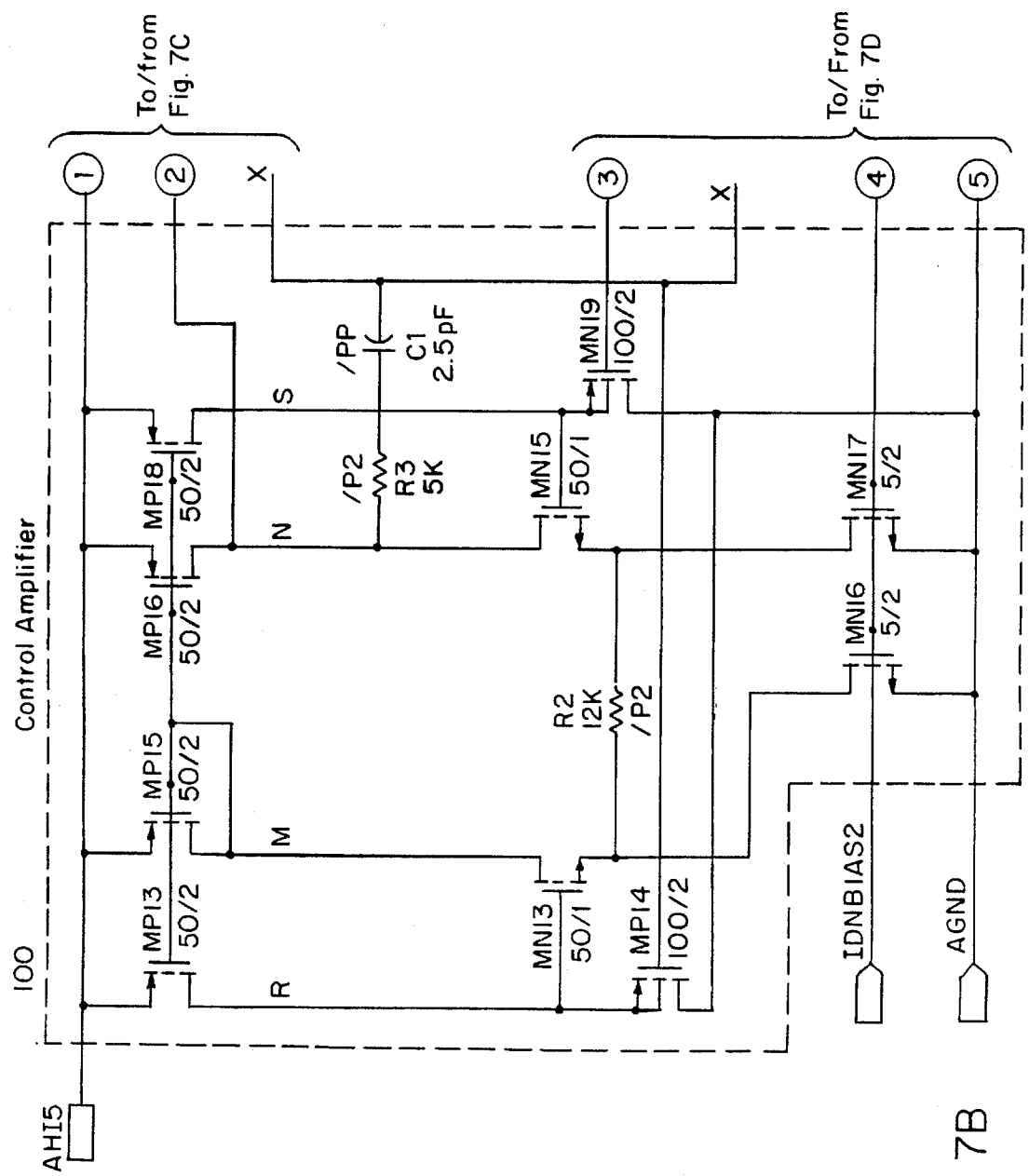
Figure 7C:
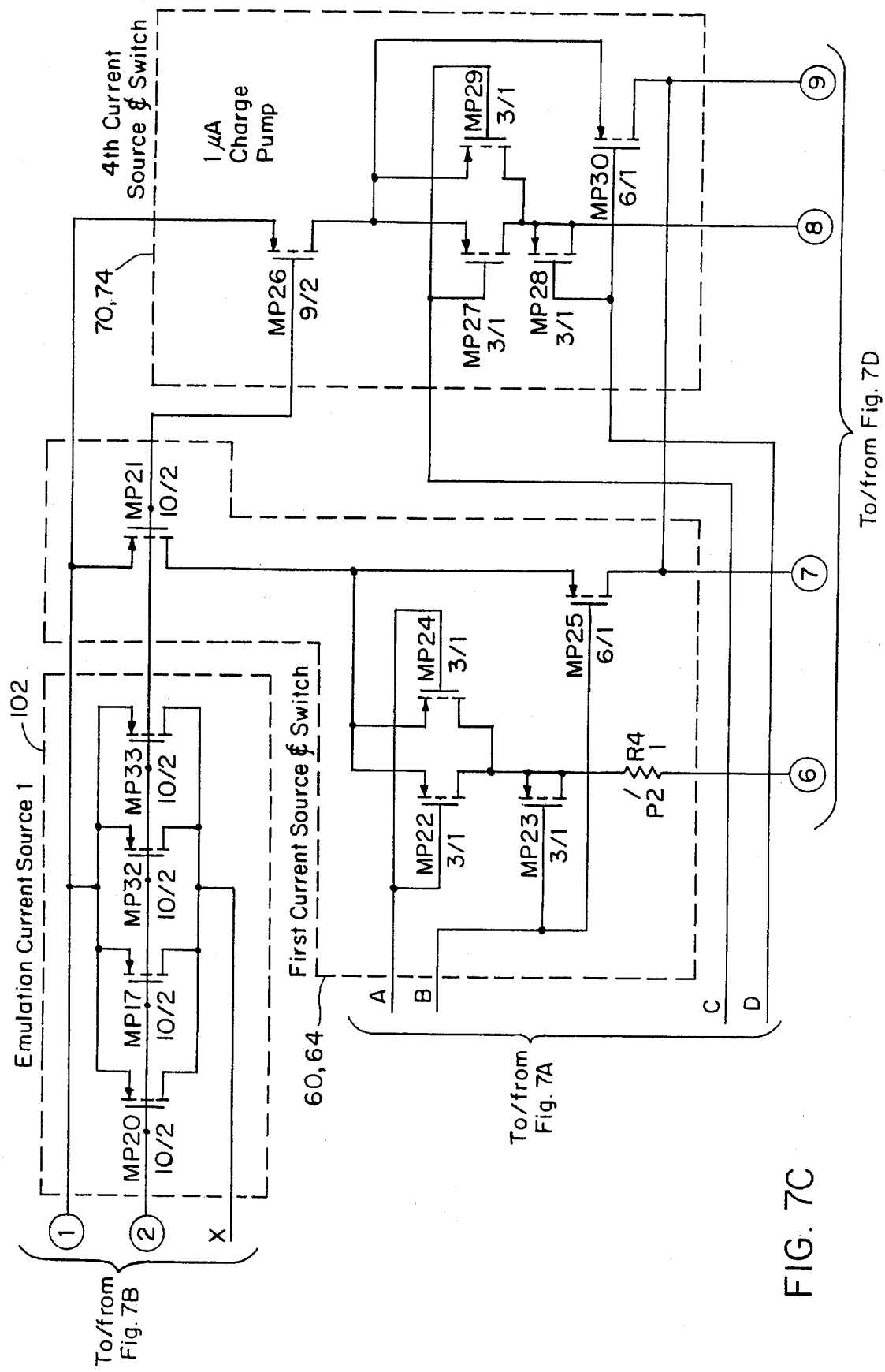
Figure 7D:
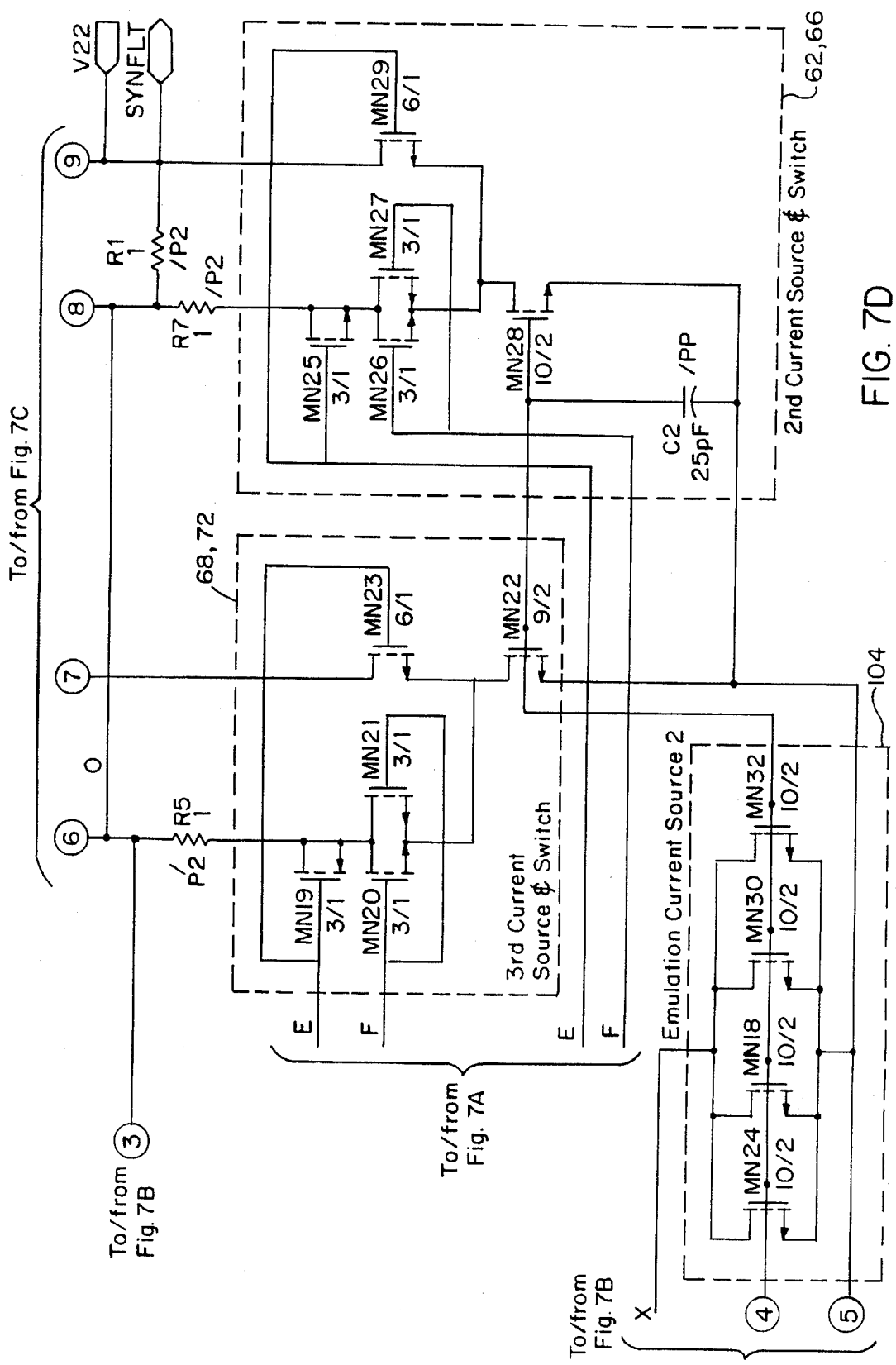

Charge pump 16', FIG. 6, is implemented in the conventional way using a pump up current source 50 and switch 52 and a pump down current source 54 and a switch 56 to provide current to capacitor 40' and resistor 42'. In the pump up mode switch 52 is closed and switch 56 is open, and in the pump down mode the converse is true. The charging of capacitor 40' establishes a voltage at point 58 which provides the positive input to oscillator control amplifier 20'. The low current charge pump 16" includes a first current source 60 providing current of a first polarity and a second current source 62 providing current of the opposite polarity. A PMOSS switch 64 controls current source 60 while an NMOSS switch 66 controls current source 62. There is a third current source 68 that provides current of the same polarity as current source 62 and a fourth current source 70 that provides current of the opposite polarity to current source 68. NMOSS switch 72 controls current source 68 and PMOSS switch 74 controls current source 70. First current source 60 provides a current of 10I/100 while complementary current source 62 provides a current of 9I/100. Similarly, current source 68 provides a current of 10I/100 while its complementary current source 70 provides a current of 9I/100. Thus the pump down signal to switch driver 80 on line 82 provides a signal on pump down 1, line 84, and pump down 2, line 86. This closes switch 64 and switch 66. Current now flows from source 60 through PMOSS switch 64 across line 88, through switch 66 and into current source 62. However, since current source 60 provides a current of 10I/100 and current source 62 absorbs a current of 9I/100, the difference current of I/100 will be diverted on line 90 to charge integrating capacitor 34'. Since current is flowing to the negative input of amplifier 20', this represents the pump down mode. If a pump up signal occurs on line 92, switch driver 80 provides a pump up 1 signal on line 94 and a pump up 2 signal on line 96. This closes switches 72 and 74. Now current flows from current source 70 through PMOSS switch 74, line 88, switch 72, and into current source 68. Since current source 70 is providing a current of 9I/100, and current source 68 is receiving a current of 10I/100, the extra I/100 portion of the current must come from line 90. Thus current flowing away from integrating capacitor 34' and the negative input of amplifier 20' represents the pump up mode. Since switches 74 and 72 are opposite polarity MOSS devices, namely NMOSS and PMOSS, any charge injection that occurs will be cancelled. The same is true for switches 64 and 66. In order to ensure that the current supplied by the sources 60, 68 and 70, 72 remain in balance, the voltage between sources 60 and 68 and sources 70 and 62 is monitored by one input to control amplifier 100. The other input to that amplifier comes from the junction between emulation current source 102 and reference current source 104. If the voltage between sources 60 and 68 and 70 and 62 drift due to changes on the voltage on the integrating capacitor 34', control amplifier will sense this and adjust the output of current source 102 which simultaneously adjusts the current output of current sources 60 and 70 to maintain the balance.

Figure 8:
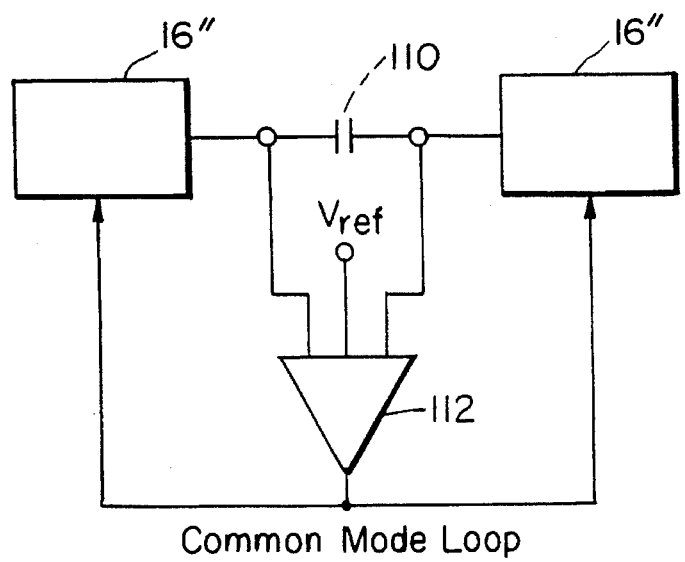
FIG. 8 is a block diagram of a differential charge pump system using a pair of charge pumps as shown in FIGS. 6 and 7.

In one specific implementation the circuit of FIG. 6 may be implemented as shown in FIGS. 7A–D. Two charge pumps 16" can be combined as shown in FIG. 8 to provide a differential charge pump system for supplying integrating capacitor 110, FIG. 8. A common mode control amplifier 112 may be connected to either side of integrating capacitor 110 for sensing the voltage on each side of the integrating capacitor 110 and driving the two charge pumps 16" to maintain the predetermined midpoint voltage on integrating capacitor 110.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A charge pump system for charging an integrated capacitor comprising:

pump down means, responsive to a pump down signal for supplying a pump down current to the integrated capacitor including:

a first current source, said first current source providing a first current, and a second current source, said second current source providing a second current which is a fraction of said first current; and switching means for connecting both said first current source and said second current source to said integrated capacitor such that the difference between said first and second currents is supplied to said integrated capacitor; and pump up means, responsive to a pump up signal, for supplying a pump up current to said integrated capacitor including:

a third current source, said third current source providing a third current, and a fourth current source to fourth current source providing a fourth current which is a fraction of said third current; and a second switching means for connecting said third current source and said fourth current source, said said integrated capacitor such that the difference between said third and fourth currents flow from said integrated capacitor.

2. The charge pump system of claim 1 further including a matching circuit for causing said first and third currents to have equal amplitudes and for causing said second and fourth currents to have equal amplitudes.

3. The charge pump system of claim 2 further including means for maintaining a balance between the current supplied by said first current source and said third current source and for maintaining a balance between the current supplied by said second current source and said fourth current source.

4. The charge pump system of claim 3 in which said means for maintaining a balance includes a control amplifier having one input connected between said first current source and said third current source and also between said second current source and said fourth current source, and another input connected between a fifth current source and a sixth current source and an output connected to said integrating capacitor.

5. A differential charge pump system for charging an integrating capacitor comprising:

first and second charge pumps each including: · a first current source means for supplying a first current, a second current source means for supplying a second current which is a fraction of said first current, a third current source means for supplying a third current, and a fourth current source means for supplying a fourth current which is a fraction of said third current; and switching means for simultaneously connecting said first and second current sources from said first charge pump to a first end of said integrating capacitor to provide said first and second currents, wherein said first current flows into said integrating capacitor and said second current flows out of said integrating capacitor; and simultaneously connecting said third and fourth current source from said second charge pump to a second end of the integrating capacitor to provide said third and fourth currents, wherein said third current flows out of said integrating capacitor and said fourth current flows into said integrating capacitor to provide a pump-down charging current; and alternately, simultaneously connecting said first and second current sources from said second charge pump to said second end of integrating capacitor to provide said first and second currents, wherein said first current flows into said integrating capacitor and said second current flows out of said integrating capacitor and simultaneously connecting said third and fourth current sources from said first charge pump to said first end of said integrating capacitor to provide said third and fourth currents, wherein said third current flows out of said integrating capacitor and said fourth current flows into said integrating capacitor to provide a pump-up charging current.

6. The differential charge pump system of claim 5 further including a common mode servo circuit for sensing the voltage on each side of said integrating capacitor and driving said charge pumps to maintain a predetermined midpoint voltage on said integrating capacitor.

\* \* \* \* \*